United States Patent
Saito et al.

(10) Patent No.: US 12,155,168 B2
(45) Date of Patent: Nov. 26, 2024

(54) LINE NARROWING GAS LASER DEVICE AND ELECTRONIC DEVICE MANUFACTURING METHOD

(71) Applicant: Gigaphoton Inc., Tochigi (JP)

(72) Inventors: Yusuke Saito, Oyama (JP); Masanori Yashiro, Oyama (JP); Hiroshi Furusato, Oyama (JP); Yosuke Watanabe, Oyama (JP); Tokinori Terao, Oyama (JP)

(73) Assignee: Gigaphoton Inc., Tochigi (JP)

( * ) Notice: Subject to any disclaimer, the term of this patent is extended or adjusted under 35 U.S.C. 154(b) by 179 days.

(21) Appl. No.: 18/163,689

(22) Filed: Feb. 2, 2023

(65) Prior Publication Data
US 2023/0187892 A1 Jun. 15, 2023

Related U.S. Application Data

(63) Continuation of application No. PCT/JP2020/034175, filed on Sep. 9, 2020.

(51) Int. Cl.
*H01S 3/08* (2023.01)
*G03F 7/00* (2006.01)
(Continued)

(52) U.S. Cl.
CPC ...... *H01S 3/08009* (2013.01); *G03F 7/70025* (2013.01); *H01S 3/034* (2013.01); *H01S 3/105* (2013.01)

(58) Field of Classification Search
CPC ........ G03F 7/70025; H01S 3/02; H01S 3/034; H01S 3/08004; H01S 3/08009; H01S 3/105; H01S 3/225
See application file for complete search history.

(56) References Cited

U.S. PATENT DOCUMENTS 5,761,236 A 6/1998 Kleinschmidt et al.
6,181,724 B1 1/2001 Tanaka et al.
(Continued)

FOREIGN PATENT DOCUMENTS

JP S49-5265 Y1 2/1974
JP S60-142581 A 7/1985
(Continued)

OTHER PUBLICATIONS

International Search Report issued in PCT/JP2020/034175; mailed Dec. 1, 2020.
(Continued)

*Primary Examiner* — Deoram Persaud
(74) *Attorney, Agent, or Firm* — Studebaker & Brackett PC

(57) ABSTRACT

A line narrowing gas laser device includes a line narrowing device, an output coupling mirror, a laser chamber arranged on an optical path of an optical resonator, a first holder which supports the output coupling mirror, a second holder which supports the first holder to be rotatable about a rotation axis of the first holder, and an adjustment device supported by the second holder and being in contact with the first holder to rotate the first holder about the rotation axis. The line narrowing device has a characteristic of changing, into a first direction, beam pointing of laser light output toward the output coupling mirror when temperature inside the line narrowing device rises. The second holder and the adjustment device rotate the first holder in a direction in which a change in the first direction in the beam pointing of the laser light is suppressed by thermal expansion.

20 Claims, 13 Drawing Sheets

(51) Int. Cl.
    *H01S 3/034*     (2006.01)
    *H01S 3/105*     (2006.01)

(56)     References Cited

U.S. PATENT DOCUMENTS

| | | |
|---|---|---|
| 2007/0091488 A1 | 4/2007 | Grapov et al. |
| 2018/0041000 A1* | 2/2018 | Miyamoto ............ G02B 17/004 |
| 2019/0181607 A1* | 6/2019 | Miyamoto ............ H01S 3/0812 |
| 2020/0014168 A1 | 1/2020 | Matsumoto et al. |
| 2021/0336407 A1* | 10/2021 | Igarashi .............. G03F 7/70575 |
| 2022/0385028 A1* | 12/2022 | Fujii ....................... H01S 3/104 |

FOREIGN PATENT DOCUMENTS

| | | |
|---|---|---|
| JP | H04-107975 A | 4/1992 |
| JP | H05-315674 A | 11/1993 |
| JP | 2001-053370 A | 2/2001 |
| JP | 2003-249702 A | 9/2003 |
| WO | 2018/198215 A1 | 11/2018 |

OTHER PUBLICATIONS

International Preliminary Report On Patentability and Written Opinion issued in PCT/JP2020/034175; issued Mar. 7, 2023.

* cited by examiner

FIG. 20

| No. | SECOND HOLDER | | EXPANSION-CONTRACTION PORTION | |
|---|---|---|---|---|
| | MATERIAL | COEFFICIENT OF THERMAL EXPANSION | MATERIAL | COEFFICIENT OF THERMAL EXPANSION |
| 1 | ALUMINUM | $23.9 \times 10^{-6}$ /°C | SUS | $18.2 \times 10^{-6}$ /°C |
| 2 | DURALUMIN | $27.3 \times 10^{-6}$ /°C | SUS | $18.2 \times 10^{-6}$ /°C |
| 3 | CERAMICS | $7.2 \times 10^{-6}$ /°C | SUS | $18.2 \times 10^{-6}$ /°C |
| 4 | COPPER | $17.7 \times 10^{-6}$ /°C | SUS | $18.2 \times 10^{-6}$ /°C |
| 5 | CERAMICS | $7.2 \times 10^{-6}$ /°C | ALUMINUM | $23.9 \times 10^{-6}$ /°C |
| 6 | COPPER | $17.7 \times 10^{-6}$ /°C | ALUMINUM | $23.9 \times 10^{-6}$ /°C |
| 7 | SUS | $18.2 \times 10^{-6}$ /°C | ALUMINUM | $23.9 \times 10^{-6}$ /°C |

LINE NARROWING GAS LASER DEVICE AND ELECTRONIC DEVICE MANUFACTURING METHOD

The present application claims the benefit of International Application No. PCT/JP2020/034175, filed on Sep. 9, 2020 the entire contents of which are hereby incorporated by reference.

BACKGROUND

1. Technical Field

The present disclosure relates to a line narrowing gas laser device and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device each have a large spectral line width of about 350 to 400 pm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. In the following, a gas laser device with a narrowed spectral line width is referred to as a line narrowing gas laser device.

LIST OF DOCUMENTS

Patent Documents

Patent Document 1: U.S. Pat. No. 5,761,236
Patent Document 2: Japanese Patent Application Publication No. 05-315674
Patent Document 3: Japanese Patent Application Publication No. 04-107975
Patent Document 4: U.S. Pat. No. 6,181,724
Patent Document 5: Japanese Patent Application Publication No. 2003-249702

SUMMARY

A line narrowing gas laser device according to an aspect of the present disclosure includes a line narrowing device including a wavelength dispersion element, an output coupling mirror, a laser chamber arranged on an optical path of an optical resonator configured by the line narrowing device and the output coupling mirror, a first holder which supports the output coupling mirror, a second holder which supports the first holder to be rotatable about a rotation axis of the first holder, and an adjustment device supported by the second holder and being in contact with the first holder to rotate the first holder about the rotation axis. Here, the line narrowing device is configured to have a characteristic of changing, into a first direction, beam pointing of laser light output toward the output coupling mirror when temperature inside the line narrowing device rises. The second holder and the adjustment device are configured to rotate the first holder in a direction in which a change in the first direction in the beam pointing of the laser light output from the output coupling mirror is suppressed by thermal expansion when temperature of the second holder and the adjustment device rises.

A line narrowing gas laser device according to another aspect of the present disclosure includes a line narrowing device including a wavelength dispersion element, an output coupling mirror, a laser chamber arranged on an optical path of an optical resonator configured by the line narrowing device and the output coupling mirror, a first holder which supports the output coupling mirror, a second holder which supports the first holder to be rotatable about a rotation axis of the first holder, and an adjustment device supported by the second holder and being in contact with the first holder to rotate the first holder about the rotation axis. Here, the second holder and the adjustment device are configured to rotate the first holder so that a part above the rotation axis of the first holder moves in an output direction of laser light output from the output coupling mirror by thermal expansion when temperature of the second holder and the adjustment device rises.

An electronic device manufacturing method according to an aspect of the present disclosure includes generating laser light using a line narrowing gas laser device, outputting the laser light to an exposure apparatus, and exposing a photosensitive substrate to the laser light in the exposure apparatus to manufacture an electronic device. Here, the line narrowing gas laser device includes a line narrowing device including a wavelength dispersion element, an output coupling mirror, a laser chamber arranged on an optical path of an optical resonator configured by the line narrowing device and the output coupling mirror, a first holder which supports the output coupling mirror, a second holder which supports the first holder to be rotatable about a rotation axis of the first holder, and an adjustment device supported by the second holder and being in contact with the first holder to rotate the first holder about the rotation axis. The line narrowing device is configured to have a characteristic of changing, into a first direction, beam pointing of the laser light output toward the output coupling mirror when temperature inside the line narrowing device rises. The second holder and the adjustment device are configured to rotate the first holder in a direction in which a change in the first direction in the beam pointing of the laser light output from the output coupling mirror is suppressed by thermal expansion when temperature of the second holder and the adjustment device rises.

BRIEF DESCRIPTION OF THE DRAWINGS

Embodiments of the present disclosure will be described below merely as examples with reference to the accompanying drawings.

FIG. 20 shows examples of materials of the second holder and an expansion-contraction portion.

DESCRIPTION OF EMBODIMENTS

Content

Figure 1:
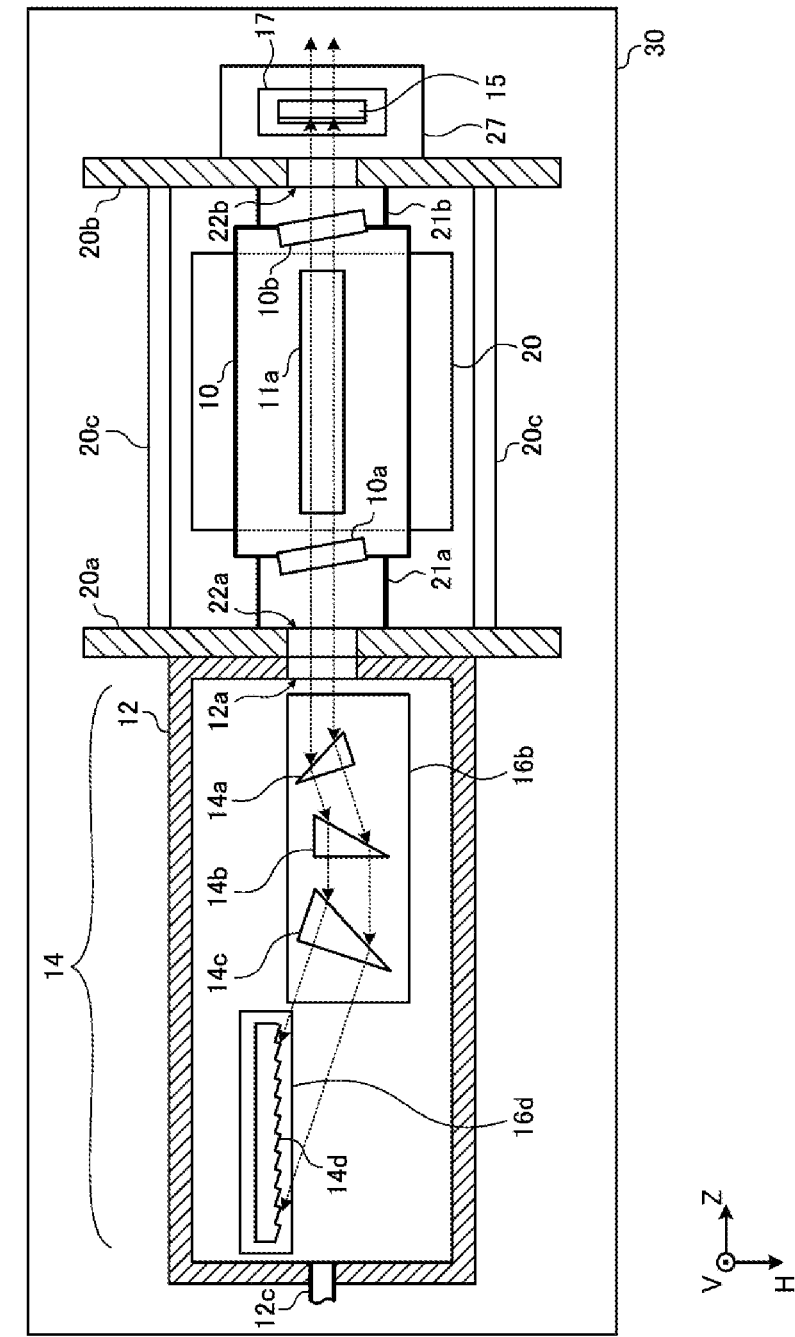
FIG. 1 schematically shows the configuration of a line narrowing gas laser device according to a comparative example.

1. Comparative example
   1.1 Configuration of line narrowing gas laser device 1
      1.1.1 Laser chamber 10
      1.1.2 Line narrowing module 14
      1.1.3 Output coupling mirror 15
   1.2 Operation
   1.3 Problem of comparative example
      1.3.1 First factor
      1.3.2 Second factor
      1.3.3 Solution to problem
2. Line narrowing gas laser device in which arrangement of tilt surface 173 of taper portion 172 is changed
   2.1 Configuration
   2.2 Operation
   2.3 Other configuration example
   2.4 Effect
3. Line narrowing gas laser device in which arrangement of adjustment device 13 is changed
   3.1 Configuration
   3.2 Operation
   3.3 Other configuration example
   3.4 Effect
4. Line narrowing gas laser device in which posture of first holder 17 is defined by three points
   4.1 Configuration
   4.2 Operation
   4.3 Other configuration example
   4.4 Effect
5. Combination of materials of second holder 27 and expansion-contraction portion 132
6. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. COMPARATIVE EXAMPLE

1.1 Configuration of Line Narrowing Gas Laser Device 1

Figure 2:
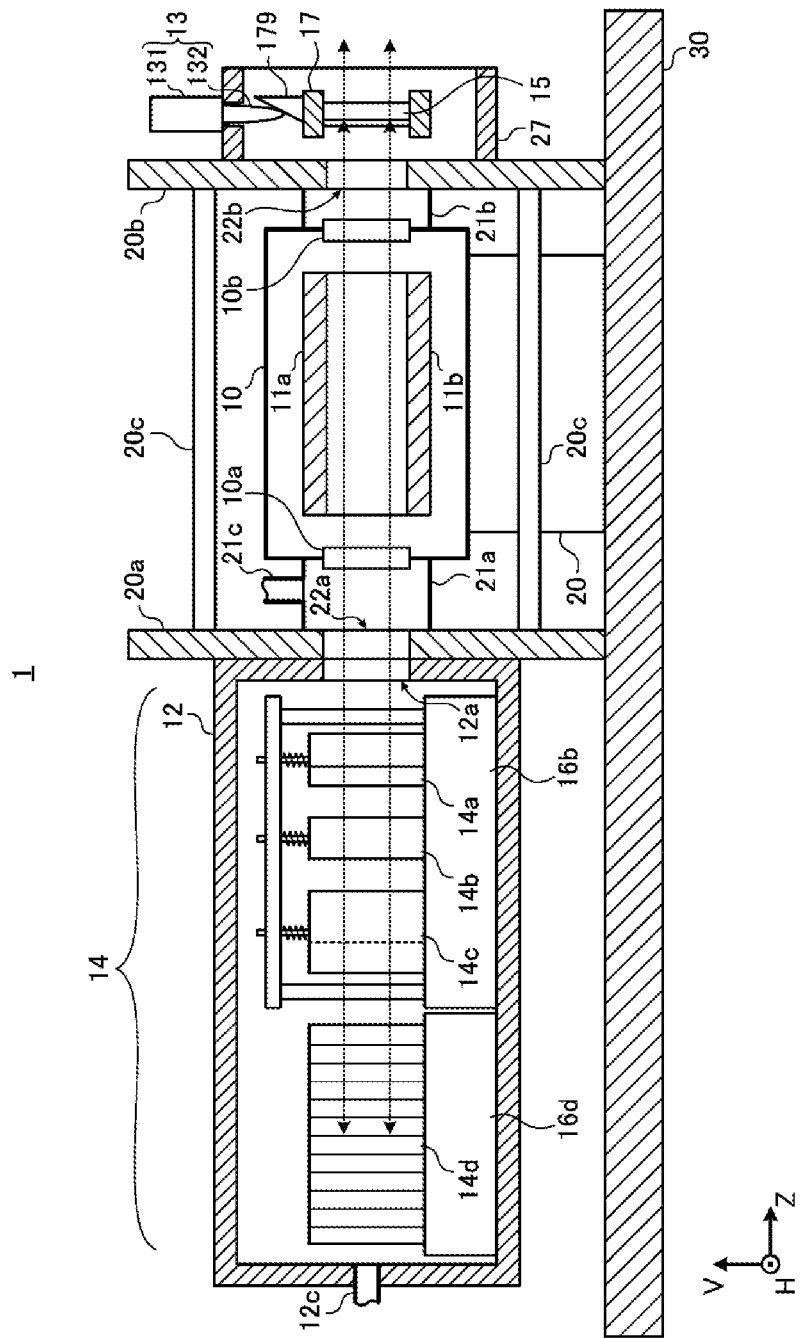
FIG. 2 schematically shows the configuration of the line narrowing gas laser device according to the comparative example.

FIGS. 1 and 2 schematically show the configuration of a line narrowing gas laser device 1 according to a comparative example. The line narrowing gas laser device 1 shown in FIGS. 1 and 2 includes a laser chamber 10, a pair of discharge electrodes 11a, 11b, a line narrowing module 14, and an output coupling mirror 15. The line narrowing module 14 and the output coupling mirror 15 configure an optical resonator. The laser chamber 10 is arranged on the optical path of the optical resonator.

FIG. 1 shows the internal configuration of the line narrowing gas laser device 1 viewed in the direction substantially parallel to a discharge direction between the discharge electrodes 11a, 11b. FIG. 2 shows the internal configuration of the line narrowing gas laser device 1 viewed from a direction substantially perpendicular to the discharge direction between the discharge electrodes 11a, 11b and substantially perpendicular to the travel direction of laser light output from the output coupling mirror 15. The travel direction of the laser light output from the output coupling mirror 15 substantially coincides with the +Z direction. The discharge direction between the discharge electrodes 11a, 11b substantially coincides with the +V direction or −V direction. The direction perpendicular to the both substantially coincides with the +H direction or −H direction. The −V direction substantially coincides with the gravity direction.

1.1.1 Laser Chamber 10

The laser chamber 10 is filled with a laser gas as a laser medium containing, for example, an argon gas or a krypton gas as a rare gas, fluorine gas as a halogen gas, a neon gas as a buffer gas, and the like. Windows 10a, 10b are arranged at both ends of the laser chamber 10.

The laser chamber 10 is supported by a holder 20. The laser chamber 10 and the holder 20 are arranged between a plate 20a and a plate 20b. One end of each of three invar-rods 20c is fixed to the plate 20a, and the other end of each of the invar-rods 20c is fixed to the plate 20b. The distance between the plate 20a and the plate 20b is determined by the invar-rods 20c. The holder 20 and the plate 20b are fixed to a base 30. The plate 20a is arranged on the base 30 via a linear bush (not shown), and is movable in the +Z direction and −Z direction by the linear bush.

A through hole 22a is formed in the plate 20a, and a through hole 22b is formed in the plate 20b. An optical path pipe 21a is connected between the plate 20a and the laser chamber 10. One end of the optical path pipe 21a is fixed in a sealed manner to a surface of the plate 20a around the through hole 22a, and the other end of the optical path pipe 21a is fixed in a sealed manner to an outer surface of the laser chamber 10 around the window 10a. An optical path pipe 21b is connected between the plate 20b and the laser chamber 10. One end of the optical path pipe 21b is fixed in a sealed manner to a surface of the plate 20b around the through hole 22b, and the other end of the optical path pipe 21b is fixed in a sealed manner to an outer surface of the laser chamber 10 around the window 10b.

The discharge electrodes 11a, 11b are arranged in the laser chamber 10. A pulse high voltage is applied between the discharge electrodes 11a, 11b from a pulse power module (not shown).

1.1.2 Line Narrowing Module 14

The line narrowing module 14 includes a plurality of prisms 14a to 14c, a grating 14d, holders 16b, 16d, and a housing 12. The line narrowing module 14 corresponds to the line narrowing device in the present disclosure. Each of the prisms 14a to 14c and the grating 14d corresponds to the wavelength dispersion element in the present disclosure. The grating 14d is an echelle grating which includes a high reflectance material and in which a large number of grooves are formed at predetermined intervals. The grating 14d is arranged in the Littrow arrangement, which causes the incident angle of the light incident on the grating 14d from the prisms 14a to 14c to coincide with the diffraction angle of the diffracted light having a desired wavelength.

The housing 12 houses the prisms 14a to 14c, the grating 14d, and the holders 16b, 16d. Inside the housing 12, the prisms 14a to 14c are supported by the holder 16b, and the grating 14d is supported by the holder 16d. Any of the prisms 14a to 14c may be rotatable in the HZ plane by a rotation stage (not shown).

The housing 12 is supported by the plate 20a. A through hole 12a is formed in the housing 12. The position of the through hole 12a of the housing 12 and the position of the through hole 22a of the plate 20a substantially overlap each other when viewed in the +Z direction, and thus the inside of the optical path pipe 21a and the inside of the housing 12 communicate with each other. A purge gas introduction pipe 12c is connected to the housing 12 at a position away from the through hole 12a. A purge gas discharge pipe 21c is connected to the optical path pipe 21a. The purge gas is introduced into the housing 12 from the purge gas introduction pipe 12c, and is discharged from the purge gas discharge pipe 21c of the optical path pipe 21a. The purge gas includes, for example, a nitrogen gas.

1.1.3 Output Coupling Mirror 15

The output coupling mirror 15 is made of a material that transmits light having a wavelength selected by the line narrowing module 14, and one surface thereof is coated with a partially reflective film. The output coupling mirror 15 is supported by a first holder 17. The first holder 17 is supported by the second holder 27 so as to be rotatable about a rotation axis (not shown) substantially parallel to the H axis. The output coupling mirror 15, the first holder 17, and the second holder 27 are housed in a housing (not shown) and supported by the plate 20b.

The first holder 17 includes a taper portion 179 having a tilt surface. An adjustment device 13 is supported by the second holder 27. The adjustment device 13 is configured by, for example, a micrometer. The adjustment device 13 includes a drive unit 131 supported by the second holder 27, and an expansion-contraction portion 132 that expands and contracts with respect to the drive unit 131 and is in contact with the first holder 17. The expansion-contraction portion 132 is in contact with the tilt surface of the taper portion 179. The drive unit 131 is configured to expand and contract the expansion-contraction portion 132 in the direction of the V axis intersecting with the tilt surface of the taper portion 179.

1.2 Operation

When the high voltage is applied between the discharge electrodes 11a, 11b, discharge occurs between the discharge electrodes 11a, 11b. The laser medium in the laser chamber 10 is excited by the energy of the discharge and shifts to a high energy level. When the excited laser medium then shifts to a low energy level, light having a wavelength corresponding to the difference between the energy levels is emitted.

The light generated in the laser chamber 10 is output to the outside of the laser chamber 10 through the windows 10a, 10b. The beam width in the direction parallel to the H axis of the light output through the window 10a of the laser chamber 10 is expanded by the prisms 14a to 14c, and then the light is incident on the grating 14d. The light incident on the grating 14d from the prisms 14a to 14c is reflected by a plurality of grooves of the grating 14d and is diffracted in the direction corresponding to a wavelength of the light.

The prisms 14a to 14c reduce the beam width in the direction parallel to the H axis of the diffracted light from the grating 14d and return the light to the discharge region of the laser chamber 10 through the window 10a. The output coupling mirror 15 transmits and outputs a part of the light output from the window 10b of the laser chamber 10, and reflects the other part back into the laser chamber 10.

In this way, the light output from the laser chamber 10 reciprocates between the line narrowing module 14 and the output coupling mirror 15, and is amplified each time the light passes through the discharge space between the discharge electrodes 11a, 11b. The light is line-narrowed each time being turned back in the line narrowing module 14. The light thus amplified is output from the output coupling mirror 15 as the laser light.

In the adjustment device 13, the drive unit 131 expands and contracts the expansion-contraction portion 132, so that the expansion-contraction portion 132 presses the tilt surface of the taper portion 179. Accordingly, the posture of the output coupling mirror 15 supported by the first holder 17 can be changed, and the beam pointing of the laser light in the vertical direction output from the output coupling mirror 15 can be changed. The beam pointing is an index indicating a tilt angle of the travel direction of the light. In the following description, when the travel direction of the light is parallel to the Z axis, the beam pointing in the vertical direction is set to 0. When the travel direction of the light is tilted upward or downward with respect to the Z axis, the beam pointing in the vertical direction is set to a positive value or a negative value, respectively.

1.3 Problem of Comparative Example

In the line narrowing gas laser device 1 according to the comparative example, the beam pointing of the laser light in the vertical direction may be tilted downward as the laser light is generated. The reason why the beam pointing is tilted downward is considered as follows.

1.3.1 First Factor

Figure 3:
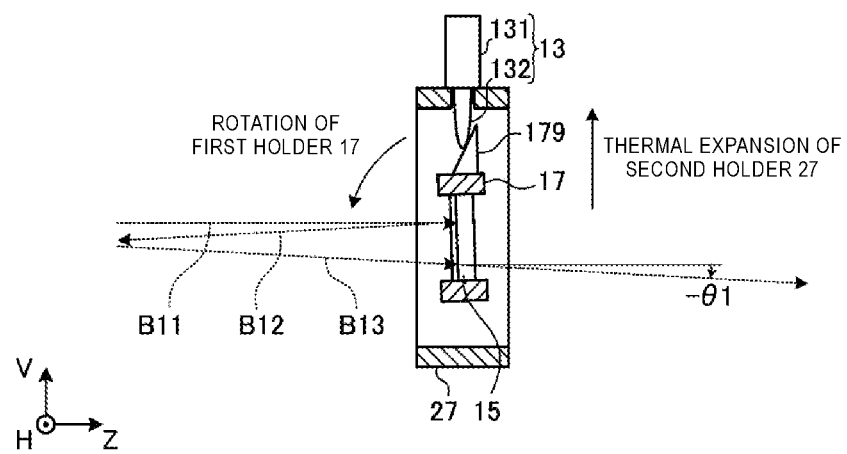
FIG. 3 shows operation of an adjustment device and a second holder in the comparative example when temperature rises.

FIG. 3 shows operation of the adjustment device 13 and the second holder 27 in the comparative example when the temperature rises. When the laser light is generated in the line narrowing gas laser device 1, the temperature of the adjustment device 13, the output coupling mirror 15, the first holder 17, the second holder 27, and the like is increased by heat conduction or heat radiation from the laser chamber 10. The temperature of these components is also increased by the energy of the light incident on the output coupling mirror 15.

In the case in which the coefficient of thermal expansion of the second holder 27 is larger than that of the expansion-contraction portion 132, when the temperature of the expansion-contraction portion 132 and the second holder 27 rises, the position of the distal end of the expansion-contraction portion 132 in contact with the tilt surface of the taper portion 179 may move in the +V direction in FIG. 3. Then, the first holder 17 is rotated counterclockwise in FIG. 3 together with the output coupling mirror 15.

Here, consideration will be given to a case in which light B11 is incident in the +Z direction toward the output coupling mirror 15 from the laser chamber 10. When the output coupling mirror 15 is rotated counterclockwise in FIG. 3, the output coupling mirror 15 reflects the light B11 as light B12 downward with respect to the −Z direction. Assuming that tilt of the light B12 is maintained when the light B12 is turned back by the line narrowing module 14 and enters the output coupling mirror 15 as light B13, the laser light transmitted through the output coupling mirror 15 among the light B13 is tilted downward with respect to the +Z direction and becomes light having the beam pointing −θ1 in the vertical direction.

In this way, when the second holder 27 and the adjustment device 13 thermally expand due to temperature rise thereof, the posture of the output coupling mirror 15 changes and the beam pointing of the laser light output from the output coupling mirror 15 may change.

1.3.2 Second Factor

Figure 4:
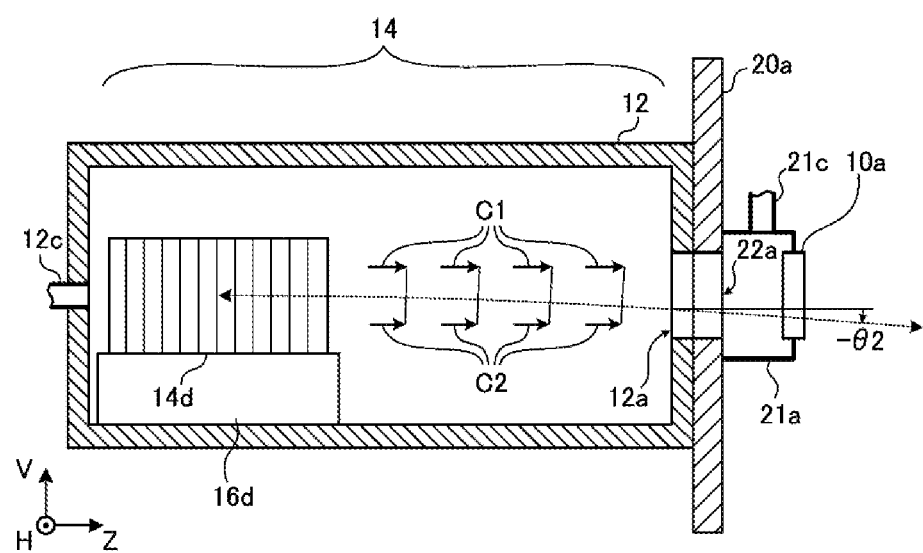
FIG. 4 shows operation of a line narrowing module in the comparative example when temperature rises.

FIG. 4 shows operation of the line narrowing module 14 in the comparative example when the temperature rises. In FIG. 4, the prisms 14a to 14c and the holder 16b are not shown.

When the laser light is generated in the line narrowing gas laser device 1, the temperature inside the housing 12 of the line narrowing module 14 also rises. The temperature rise inside the housing 12 is not uniform, and the upper part of the space inside the housing 12 tends to have a higher temperature than a lower part thereof. The refractive index of the nitrogen gas tends to decrease as the temperature rises. On the other hand, an uneven temperature distribution also occurs inside the prisms 14a to 14c, and an upper part of each of the prisms 14a to 14c tends to have a higher temperature than a lower part thereof. The prisms 14a to 14c are made of, for example, calcium fluoride, and the refractive index of calcium fluoride also tends to decrease as the temperature rises.

The refractive index is proportional to the inverse of the light speed in the medium, and the lower the refractive index is, the faster the light speed is in the medium. That is, the light speed in the medium becomes faster as the temperature becomes higher. Therefore, on the optical path inside the housing 12, the light speed C1 at the upper part becomes faster than the light speed C2 at the lower part. As a result, since the wavefront of the light is tilted downward, the light output from the line narrowing module 14 toward the output coupling mirror 15 is tilted downward with respect to the +Z direction, and becomes light having beam pointing −θ2 in the vertical direction. That is, the line narrowing module 14 has a characteristic of changing the beam pointing of the light output toward the output coupling mirror 15 downward when the temperature inside the housing 12 rises.

1.3.3 Solution to Problem

The present inventors have found that the beam pointing of the laser light output from the output coupling mirror 15 is tilted downward due to a combination of a plurality of factors as described above. In some embodiments described below, when the second holder 27 and the adjustment device 13 thermally expand due to temperature rise thereof, the first holder 17 is rotated in the direction of suppressing the change in the beam pointing of the laser light.

2. LINE NARROWING GAS LASER DEVICE IN WHICH ARRANGEMENT OF TILT SURFACE 173 OF TAPER PORTION 172 IS CHANGED

2.1 Configuration

Figure 5:
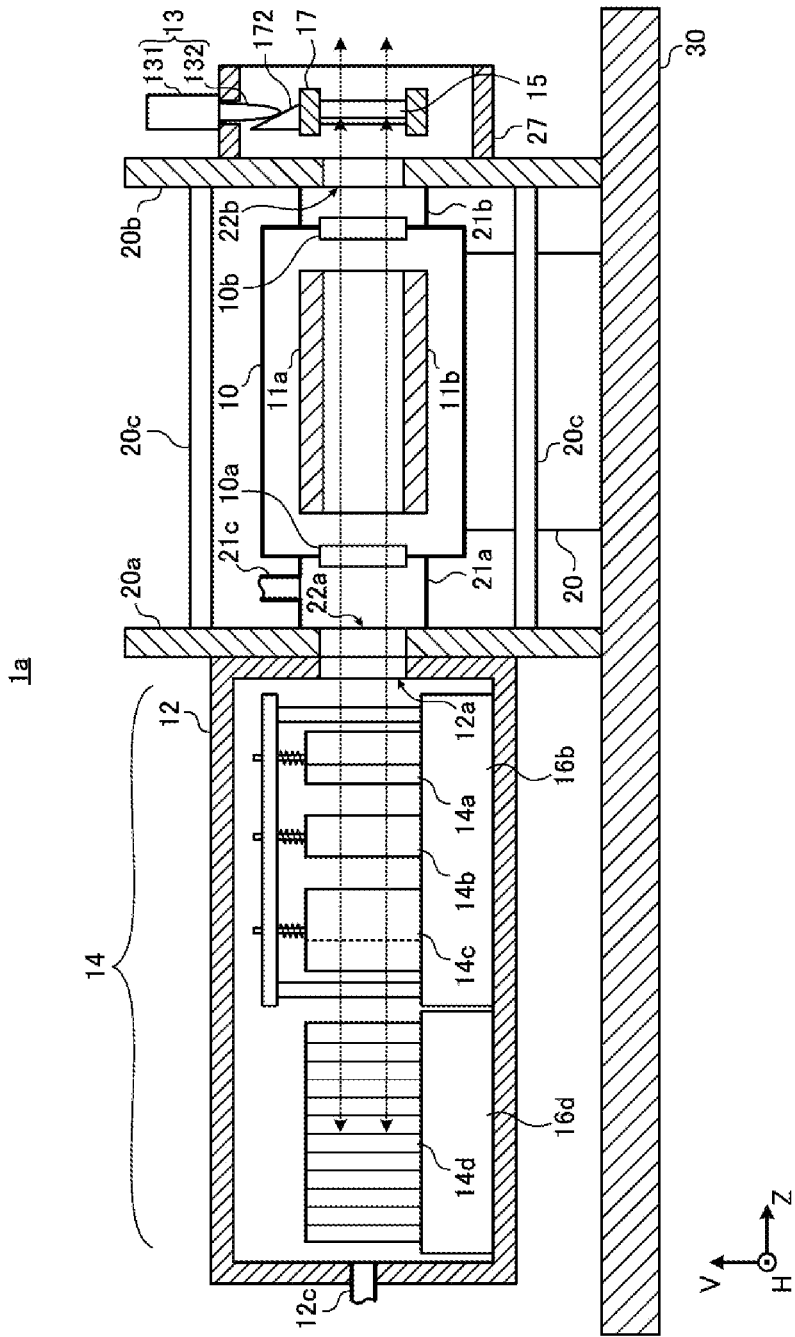
FIG. 5 schematically shows the configuration of the line narrowing gas laser device according to a first embodiment.

FIG. 5 schematically shows the configuration of a line narrowing gas laser device 1a according to a first embodiment. FIG. 5 corresponds to a view of the line narrowing gas laser device 1a viewed from the same direction as FIG. 2 in the comparative example. The first holder 17 of the first embodiment includes a taper portion 172. The taper portion 172 differs from the taper portion 179 in the comparative example in the arrangement of the tilt surface.

Figure 6:
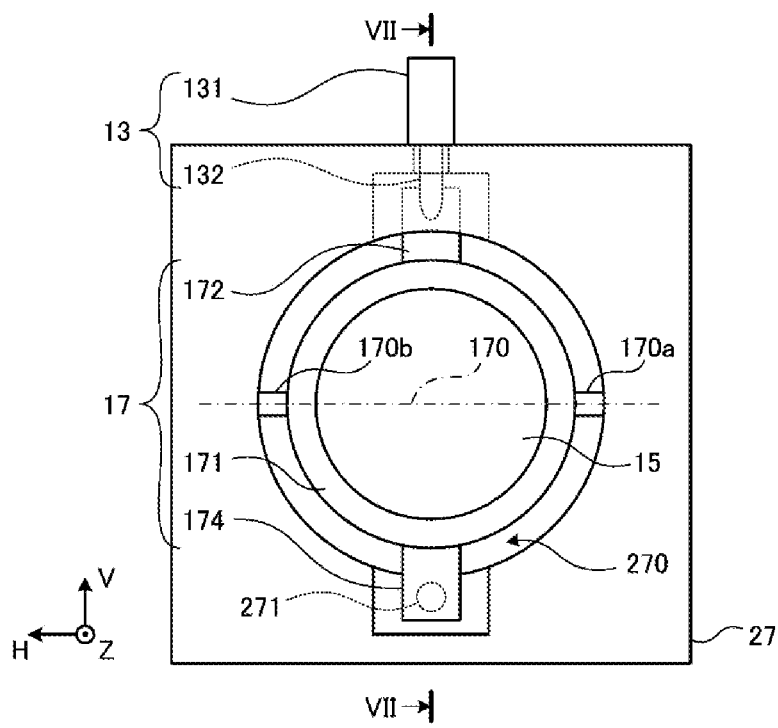
FIG. 6 shows in detail the configuration of the adjustment device, an output coupling mirror, a first holder, and the second holder in the first embodiment.
Figure 7:
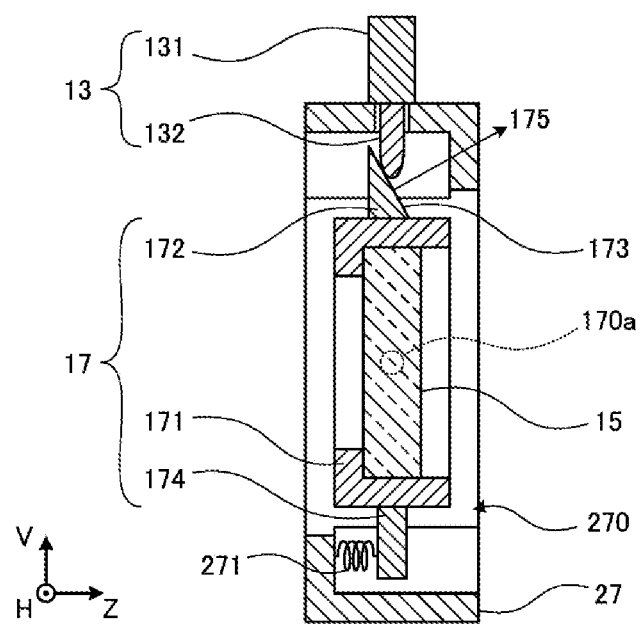
FIG. 7 is a sectional view taken along line VII-VII of FIG. 6.

FIG. 6 shows in detail the configuration of the adjustment device 13, the output coupling mirror 15, the first holder 17, and the second holder 27 in the first embodiment. FIG. 7 is a sectional view taken along line VII-VII of FIG. 6. The output coupling mirror 15 is formed of a disk-shaped member.

The first holder 17 includes an annular portion 171, the taper portion 172, and a protrusion portion 174. The annular portion 171 surrounds the outer periphery of the output coupling mirror 15 and supports the output coupling mirror 15. The taper portion 172 is fixed to the upper end of the annular portion 171. The taper portion 172 has a tilt surface 173. The tilt surface 173 is located above the output coupling mirror 15. A normal line 175 of the tilt surface 173 in the direction away from the taper portion 172 has a direction component in the +Z direction and a direction component in the +V direction. The protrusion portion 174 is fixed to the lower end of the annular portion 171.

The second holder 27 includes a through hole 270, and the first holder 17 is arranged inside the through hole 270. The second holder 27 supports the first holder 17 to be rotatable about a rotation axis 170 of the first holder 17. The rotation axis 170 is defined by axial support portions 170a, 170b arranged between the first holder 17 and the second holder 27. The axial support portions 170a, 170b are located on the −H side and the +H side of the first holder 17, and the rotation axis 170 is substantially parallel to the H axis.

The drive unit 131 of the adjustment device 13 is fixedly supported on the upper end of the second holder 27. The expansion-contraction portion 132 penetrates the second holder 27, and the distal end of the expansion-contraction portion 132 is in contact with the tilt surface 173 of the first holder 17. The drive unit 131 is configured to expand and contract the expansion-contraction portion 132 in the direction of the V axis intersecting the tilt surface 173.

One end of the spring 271 is fixed to the second holder 27. The other end of the spring 271 is fixed to a surface of the protrusion portion 174 on the −Z side. The spring 271 is in tension.

2.2 Operation

When the drive unit 131 of the adjustment device 13 expands the expansion-contraction portion 132 in the −V direction, the distal end of the expansion-contraction portion 132 presses the tilt surface 173 in the direction opposite to the normal line 175. Then, the first holder 17 is rotated about the rotation axis 170 counterclockwise in FIG. 7 together with the output coupling mirror 15. As a result, the spring 271 is further pulled.

When the drive unit 131 of the adjustment device 13 contracts the expansion-contraction portion 132, the distal end of the expansion-contraction portion 132 moves in the +V direction, which is a direction away from the tilt surface 173. When the protrusion portion 174 is pulled by the spring 271, the first holder 17 is rotated about the rotation axis 170 clockwise in FIG. 7 together with the output coupling mirror 15. Accordingly, the tilt surface 173 moves in the direction of the normal line 175, and the state in which the expansion-contraction portion 132 and the tilt surface 173 are in contact with each other is maintained.

Figure 8:
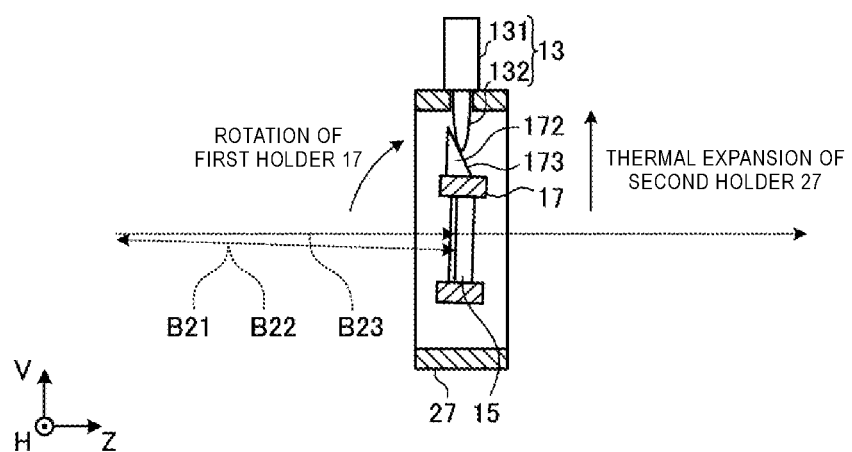
FIG. 8 shows operation of the adjustment device and the second holder in the first embodiment when temperature rises.

FIG. 8 shows the operation of the adjustment device 13 and the second holder 27 in the first embodiment when the temperature rises. In the case in which the coefficient of thermal expansion of the second holder 27 is larger than that of the expansion-contraction portion 132, when the temperature of the expansion-contraction portion 132 and the second holder 27 rises, the position of the distal end of the expansion-contraction portion 132 in contact with the tilt surface 173 of the taper portion 172 moves in the +V direction in FIG. 8. As a result, the first holder 17 is rotated clockwise in FIG. 8 together with the output coupling mirror 15 in the same manner as in the case in which the drive unit 131 contracts the expansion-contraction portion 132. That is, when the adjustment device 13 and the second holder 27 thermally expand, the first holder 17 is rotated so that a part of the first holder 17 above the rotation axis 170 is moved in the +Z direction.

Here, consideration will be given to a case in which light B21 tilted downward with respect to the +Z direction is incident toward the output coupling mirror 15 from the laser chamber 10. Even in the case in which the light B21 is tilted downward with respect to the +Z direction, when the output coupling mirror 15 is tilted clockwise in FIG. 8, the output coupling mirror 15 can reflect the light B21 as light B22 tilted upward with respect to the −Z direction. By tilting the light B22 upward, light B23 turned back by the line narrowing module 14 is suppressed from being tilted downward. Therefore, the laser light output from the output coupling mirror 15 is suppressed from being tilted downward with respect to the +Z direction. Thus, in the first embodiment, when the second holder 27 and the adjustment device 13 thermally expand due to temperature rise thereof, the first holder 17 is rotated in the direction to suppress downward change of the beam pointing of the laser light output from the output coupling mirror 15.

Figure 9:
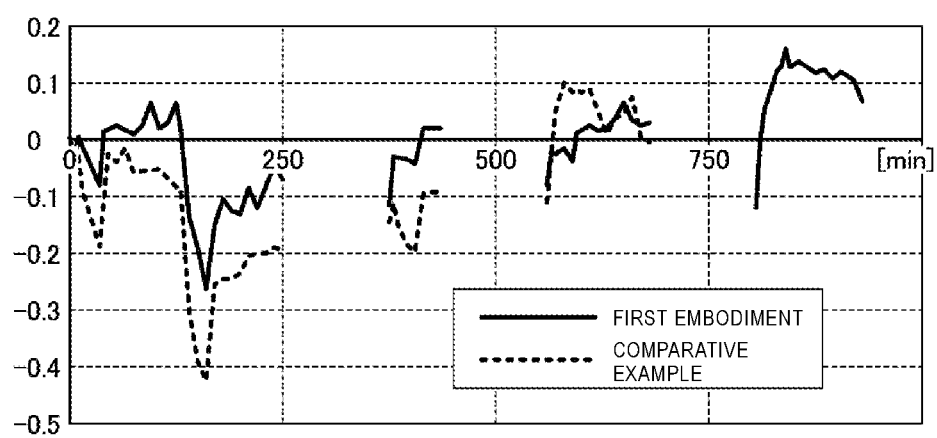
FIG. 9 is a graph showing measurement results of beam pointing of laser light in the vertical direction in each of the first embodiment and the comparative example.

FIG. 9 is a graph showing measurement results of beam pointing in the vertical direction of the laser light in each of the first embodiment and the comparative example. In FIG. 9, the horizontal axis represents time, and the vertical axis represents beam pointing in the vertical direction. When the value of the beam pointing in the vertical direction is positive, it indicates that the laser light is tilted upward with respect to the +Z direction, and when the value of the beam pointing in the vertical direction is negative, it indicates that the laser light is tilted downward with respect to the +Z direction.

The factors of the change in the beam pointing include the temperature rise of the second holder 27 and the adjustment device 13 described with reference to FIG. 3, that is, the first factor, and the temperature distribution inside the housing 12 described with reference to FIG. 4, that is, the second factor. These factors do not necessarily change the beam pointing in proportion to time, and may vary depending on the operating conditions of the line narrowing gas laser device 1a. In the comparative example, the laser light has a strong tendency to have a negative value of the beam pointing in the vertical direction and to be tilted downward with respect to the +Z direction. On the other hand, in the first embodiment, the tendency of the value of the beam pointing in the vertical direction to be negative is alleviated, and the value of the beam pointing in the vertical direction can be stably obtained around 0.

2.3 Other Configuration Example

In the first embodiment described with reference to FIGS. 6 and 7, description is provided on the case in which the output coupling mirror 15 rotates about the rotation axis 170 substantially parallel to the H axis, but the present disclosure is not limited thereto. For example, the second holder 27 may be supported by a third holder (not shown) so as be rotated about a rotation axis substantially parallel to the V axis. An adjustment device (not shown) that adjusts the rotation angle of the second holder 27 about the rotation axis substantially parallel to the V axis may be fixed to the third holder. This makes it possible to adjust the rotation angle of the output coupling mirror 15 about the axis substantially parallel to the V axis.

Figure 10:
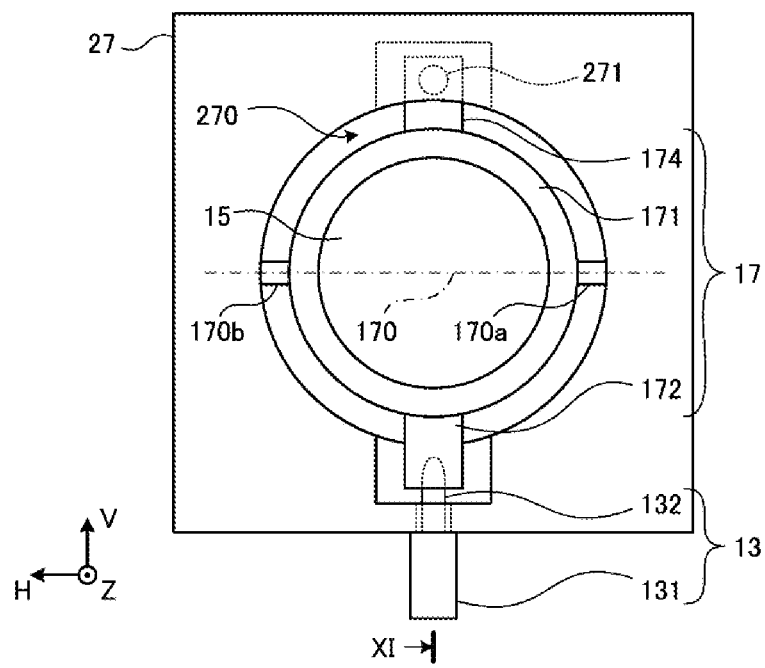
FIG. 10 shows in detail the configuration of the adjustment device, the output coupling mirror, the first holder, and the second holder in a modification of the first embodiment.
Figure 11:
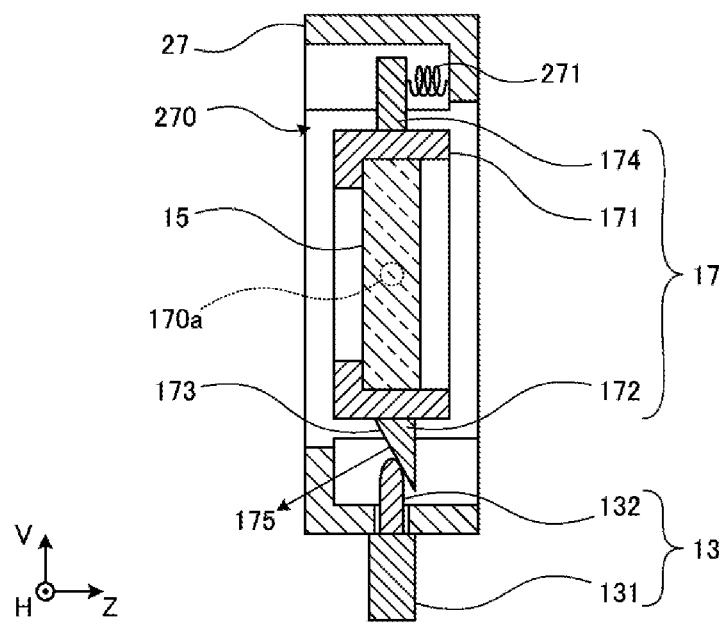
FIG. 11 is a sectional view taken along line XI-XI of FIG. 10.

In the first embodiment described with reference to FIGS. 6 and 7, the taper portion 172 is fixed to the upper end of the annular portion 171, but the present disclosure is not limited thereto. FIG. 10 shows in detail the configuration of the adjustment device 13, the output coupling mirror 15, the first holder 17, and the second holder 27 in a modification of the first embodiment. FIG. 11 is a sectional view taken along line XI-XI of FIG. 10.

In this modification, the taper portion 172 is fixed to the lower end of the annular portion 171. The tilt surface 173 of the taper portion 172 is located below the output coupling mirror 15. The normal line 175 of the tilt surface 173 in the direction away from the taper portion 172 has a direction component in the −Z direction and a direction component in the −V direction. That is, the arrangement of the taper portion 172 in the modification corresponds to the arrangement obtained by rotating the taper portion 172 in the first embodiment by 180° about the rotation axis 170. Similarly, the arrangement of the adjustment device 13, the protrusion portion 174, and the spring 271 in the modification corresponds to the arrangement obtained by rotating the corresponding components in the first embodiment by 180° about the rotation axis 170.

In the case in which the coefficient of thermal expansion of the second holder 27 is larger than that of the expansion-contraction portion 132, when the temperature of the expansion-contraction portion 132 and the second holder 27 rises, the position of the distal end of the expansion-contraction portion 132 in contact with the tilt surface 173 of the taper portion 172 moves in the −V direction. Then, the first holder 17 is rotated clockwise in FIG. 11 together with the output coupling mirror 15. Therefore, also in the modification, similarly to the first embodiment, the laser light output from the output coupling mirror 15 is suppressed from being tilted downward with respect to the +Z direction.

2.4 Effect

According to the first embodiment and the modification thereof, the line narrowing gas laser device 1a includes the line narrowing module 14, the output coupling mirror 15, the laser chamber 10, the first holder 17, the second holder 27, and the adjustment device 13. The line narrowing module 14 includes the prisms 14a to 14c and the grating 14d. The laser chamber 10 is arranged on the optical path of the laser resonator configured by the line narrowing module 14 and the output coupling mirror 15. The first holder 17 supports the output coupling mirror 15. The second holder 27 supports the first holder 17 to be rotatable about the rotation axis 170 of the first holder 17. The adjustment device 13 is supported by the second holder 27 and in contact with the first holder 17 to rotate the first holder 17 about the rotation axis 170. The line narrowing module 14 has a characteristic of changing, into a first direction, the beam pointing of the light output toward the output coupling mirror 15 when the temperature inside the housing 12 of the line narrowing module 14 rises. The first direction is, for example, a direction tilted downward with respect to the +Z direction. The second holder 27 and the adjustment device 13 are configured to rotate the first holder 17 in the direction of suppressing the change into the first direction in the beam pointing of the laser light output from the output coupling mirror 15 by the thermal expansion when the temperature of the second holder 27 and the adjustment device 13 rises.

According to this, since the first holder 17 is rotated in the direction of suppressing the change into the first direction in the beam pointing of the laser light by the thermal expansion of the second holder 27 and the adjustment device 13, the change in the beam pointing due to the thermal characteristics can be automatically reduced. As a result, the beam pointing of the laser light is stabilized, and when the line narrowing gas laser device 1a is used as, for example, a light source of an exposure apparatus, the exposure quality is improved.

According to the first embodiment and the modification thereof, the first holder 17 includes the tilt surface 173, and the expansion-contraction portion 132 is in contact with the tilt surface 173 and expands and contracts in the direction intersecting the tilt surface 173. According to this, by setting the tilt angle of the tilt surface 173, it is possible to adjust the rotation angle of the first holder 17 with respect to the movement amount of the position of the distal end of the expansion-contraction portion 132. Therefore, the change in the beam pointing of the laser light can be appropriately reduced.

According to the first embodiment, the first holder 17 includes the taper portion 172 having the tilt surface 173 at a position above the output coupling mirror 15. The normal line 175 of the tilt surface 173 in the direction away from the taper portion 172 has a direction component in the +Z direction which is an output direction of the laser light, and a direction component in the +V direction which is a direction opposite to the gravity direction. Then, the expansion-contraction portion 132 is in contact with the tilt surface 173 and expands and contracts in the direction intersecting the tilt surface 173. According to this, when the distal end position of the expansion-contraction portion 132 moves in the +V direction due to the thermal expansion of the second holder 27 and the expansion-contraction portion 132, the first holder 17 is rotated so that a part of the first holder 17 above the rotation axis 170 moves in the +Z direction. Thus, the change in the beam pointing can be reduced.

According to the modification of the first embodiment (see FIGS. 10 and 11), the first holder 17 includes the taper portion 172 having the tilt surface 173 at a position below the output coupling mirror 15, and the normal line 175 of the tilt surface 173 in the direction away from the taper portion 172 has a direction component in the −Z direction which is the direction opposite to the output direction of the laser light, and a direction component in the −V direction which is the gravity direction. Then, the expansion-contraction portion 132 is in contact with the tilt surface 173 and expands and contracts in the direction intersecting the tilt surface 173. According to this, when the distal end position of the expansion-contraction portion 132 moves in the −V direction due to the thermal expansion of the second holder 27 and the expansion-contraction portion 132, the first holder 17 is rotated so that a part of the first holder 17 above the rotation axis 170 moves in the +Z direction. Thus, the change in the beam pointing can be reduced.

According to the first embodiment and the modification thereof, the second holder 27 and the adjustment device 13 are configured to rotate the first holder 17 in the direction of causing the upper part above the rotation axis 170 of the first holder 17 to move toward the +Z direction which is the output direction of the laser light output from the output coupling mirror 15 by the thermal expansion when the temperature of the second holder 27 and the adjustment device 13 rises. According to this, in the case in which the beam pointing of the light output toward the output coupling mirror 15 is tilted downward with respect to the +Z direction when the temperature inside the housing 12 of the line narrowing module 14 is increased, it is possible to suppress the beam pointing from being tilted downward with respect to the +Z direction by rotating the first holder 17. In other respects, the first embodiment and the modification thereof are similar to the comparative example.

3. LINE NARROWING GAS LASER DEVICE IN WHICH ARRANGEMENT OF ADJUSTMENT DEVICE 13 IS CHANGED

3.1 Configuration

Figure 12:
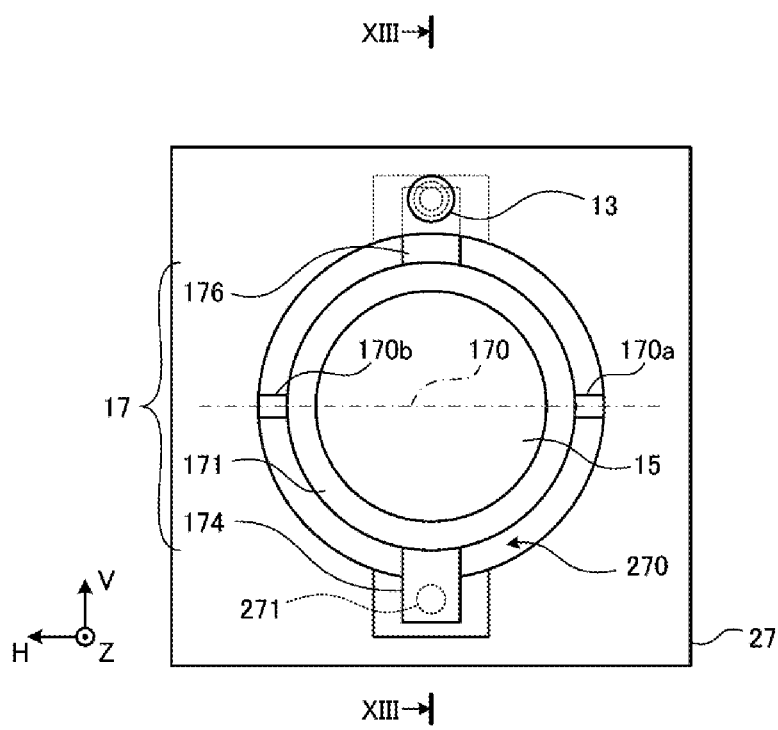
FIG. 12 shows in detail the configuration of the adjustment device, the output coupling mirror, the first holder, and the second holder in a second embodiment.
Figure 13:
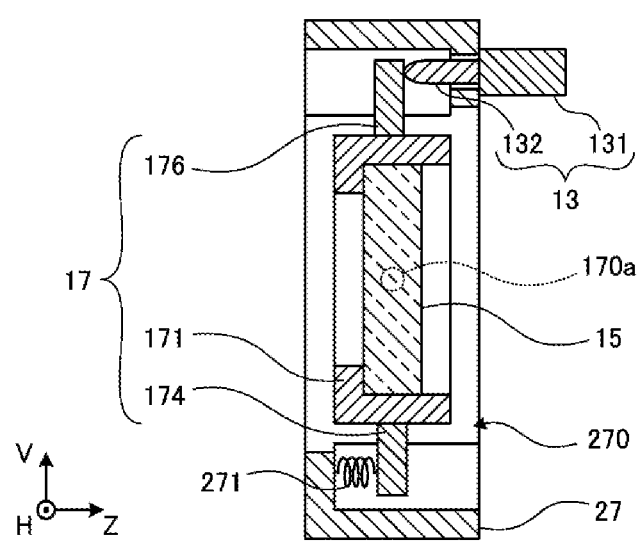
FIG. 13 is a sectional view taken along line XIII-XIII of FIG. 12.

FIG. 12 shows in detail the configuration of the adjustment device 13, the output coupling mirror 15, the first holder 17, and the second holder 27 in a second embodiment. FIG. 13 is a sectional view taken along line XIII-XIII of FIG. 12.

In the second embodiment, the first holder 17 includes a protrusion portion 176 above the rotation axis 170 of the first holder 17 in place of the taper portion 172 in the first embodiment. Further, the adjustment device 13 is arranged at a position on the +Z side with respect to the first holder 17. Specifically, the drive unit 131 is fixed not to the upper end of the second holder 27 but to a surface of the second holder 27 on the +Z side. The expansion-contraction portion 132 is configured to expand and contract in the direction parallel to the Z axis. That is, the expansion-contraction direction of the expansion-contraction portion 132 has a direction component parallel to the output direction of the laser light output from the output coupling mirror 15. The distal end of the expansion-contraction portion 132 is in contact with a surface of the protrusion portion 176 on the +Z side.

3.2 Operation

When the drive unit 131 expands the expansion-contraction portion 132 in the −Z direction, the distal end of the expansion-contraction portion 132 presses the protrusion portion 176 in the −Z direction. Then, the first holder 17 is rotated about the rotation axis 170 counterclockwise in FIG. 13 together with the output coupling mirror 15. As a result, the spring 271 is further pulled.

When the drive unit 131 contracts the expansion-contraction portion 132, the distal end of the expansion-contraction portion 132 moves in the +Z direction which is the direction away from the protrusion portion 176. When the protrusion portion 174 is pulled by the spring 271, the first holder 17 is rotated about the rotation axis 170 clockwise in FIG. 13 together with the output coupling mirror 15. Accordingly, the protrusion portion 176 moves in the +Z direction, and the state in which the expansion-contraction portion 132 and the protrusion portion 176 are in contact with each other is maintained.

In the case in which the coefficient of thermal expansion of the second holder 27 is larger than that of the expansion-contraction portion 132, when the temperature of the expansion-contraction portion 132 and the second holder 27 rises, the position of the distal end of the expansion-contraction portion 132 in contact with the protrusion portion 176 moves in the +Z direction. As a result, the first holder 17 is rotated clockwise in FIG. 13 together with the output coupling mirror 15 in the same manner as in the case in which the drive unit 131 contracts the expansion-contraction portion 132. That is, the first holder 17 is rotated so that a part of the first holder 17 above the rotation axis 170 is moved in the +Z direction.

Therefore, the laser light output from the output coupling mirror 15 is suppressed from being tilted downward with respect to the +Z direction. Thus, when the second holder 27 and the adjustment device 13 thermally expand due to temperature rise thereof, the first holder 17 is rotated in the direction to suppress downward change of the beam pointing of the laser light output from the output coupling mirror 15.

3.3 Other Configuration Example

In the second embodiment described with reference to FIGS. 12 and 13, description is provided on the case in which the output coupling mirror 15 rotates about the rotation axis 170 substantially parallel to the H axis, but the present disclosure is not limited thereto. For example, the second holder 27 may be supported by a third holder (not shown) so as be rotated about a rotation axis substantially parallel to the V axis. An adjustment device (not shown) that adjusts the rotation angle of the second holder 27 about the rotation axis substantially parallel to the V axis may be fixed to the third holder. This makes it possible to adjust the rotation angle of the output coupling mirror 15 about the axis substantially parallel to the V axis.

Figure 14:
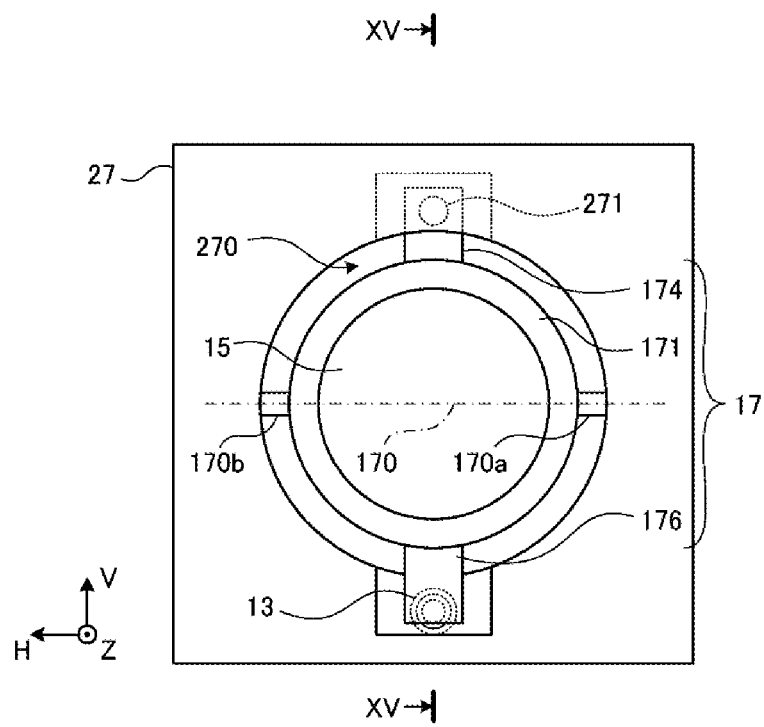
FIG. 14 shows in detail the configuration of the adjustment device, the output coupling mirror, the first holder, and the second holder in a modification of the second embodiment.
Figure 15:
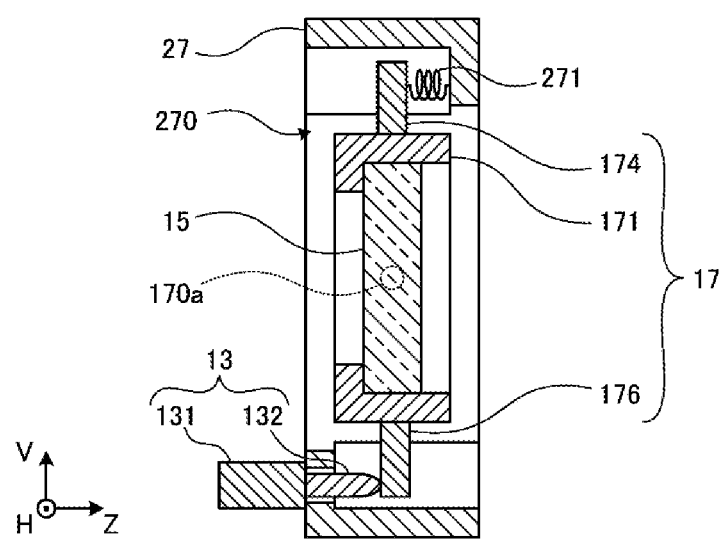
FIG. 15 is a sectional view taken along line XV-XV of FIG. 14.

In the second embodiment described with reference to FIGS. 12 and 13, the adjustment device 13 is located on the +Z side which is the output side of the laser light with respect to the first holder 17, but the present disclosure is not limited thereto. FIG. 14 shows in detail the configuration of the adjustment device 13, the output coupling mirror 15, the first holder 17, and the second holder 27 in a modification of the second embodiment. FIG. 15 is a sectional view taken along line XV-XV of FIG. 14.

In this modification, the adjustment device 13 is arranged at a position on the −Z side with respect to the first holder 17. Specifically, the drive unit 131 is fixed to a surface on the −Z side of the second holder 27. That is, the arrangement of the adjustment device 13 in the modification corresponds to the arrangement obtained by rotating the adjustment device 13 in the second embodiment by 180° about the rotation axis 170. Similarly, the arrangement of the protrusion portion 174, the protrusion portion 176, and the spring 271 in the modification corresponds to the arrangement obtained by rotating the corresponding components in the second embodiment by 180° about the rotation axis 170.

In the case in which the coefficient of thermal expansion of the second holder 27 is larger than that of the expansion-contraction portion 132, when the temperature of the expansion-contraction portion 132 and the second holder 27 rises, the position of the distal end of the expansion-contraction portion 132 in contact with the protrusion portion 176 moves in the −Z direction of FIG. 15. Then, the first holder 17 is rotated clockwise in FIG. 15 together with the output coupling mirror 15. Therefore, also in the modification, similarly to the second embodiment, the laser light output from the output coupling mirror 15 is suppressed from being tilted downward with respect to the +Z direction.

3.4 Effect

According to the second embodiment and the modification thereof, the expansion-contraction direction of the expansion-contraction portion 132 has a direction component parallel to the +Z direction which is the output direction of the laser light. According to this, for example, when the third holder (not shown) is arranged so that the second holder 27 can rotate about a rotation axis substantially parallel to the V axis, the third holder can be arranged in a compact manner.

According to the second embodiment, the adjustment device 13 is located on the +Z side which is the output side of the laser light with respect to the first holder 17, and the expansion-contraction portion 132 is in contact with the surface of the part of the first holder 17 above the rotation axis 170. According to this, when the distal end position of the expansion-contraction portion 132 moves in the +Z direction due to the thermal expansion of the second holder 27 and the expansion-contraction portion 132, the first holder 17 is rotated so that a part of the first holder 17 above the rotation axis 170 moves in the +Z direction. Thus, the change in the beam pointing can be reduced.

According to the modification of the second embodiment (see FIGS. 14 and 15), the adjustment device 13 is located on the −Z side which is opposite to the output side of the laser light with respect to the first holder 17, and the expansion-contraction portion 132 is in contact with the surface of the part of the first holder 17 below the rotation axis 170. According to this, when the distal end position of the expansion-contraction portion 132 moves in the −Z direction due to the thermal expansion of the second holder 27 and the expansion-contraction portion 132, the first holder 17 is rotated so that a part of the first holder 17 above the rotation axis 170 moves in the +Z direction. Thus, the change in the beam pointing can be reduced. In other respects, the second embodiment and the modification thereof are similar to the first embodiment and the modification thereof.

4. LINE NARROWING GAS LASER DEVICE IN WHICH POSTURE OF FIRST HOLDER 17 IS DEFINED BY THREE POINTS

4.1 Configuration

Figure 16:
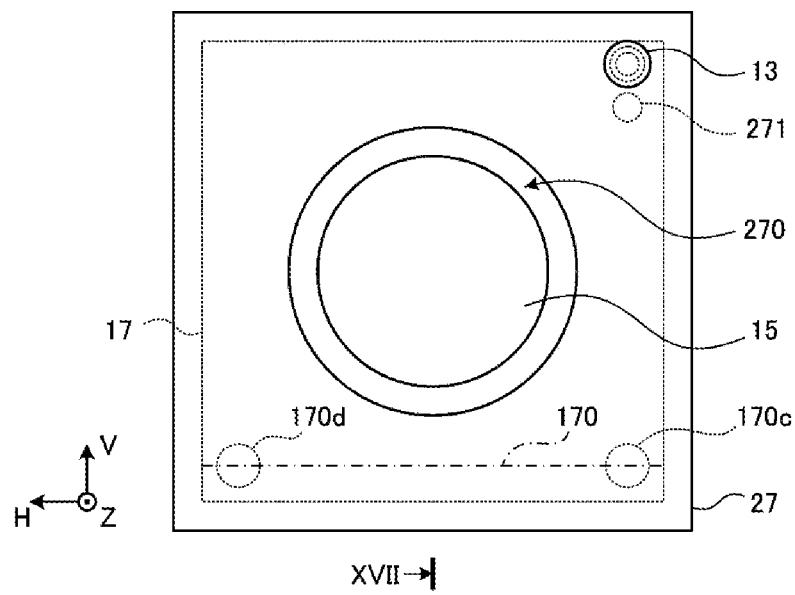
FIG. 16 shows in detail the configuration of the adjustment device, the output coupling mirror, the first holder, and the second holder in a third embodiment.
Figure 17:
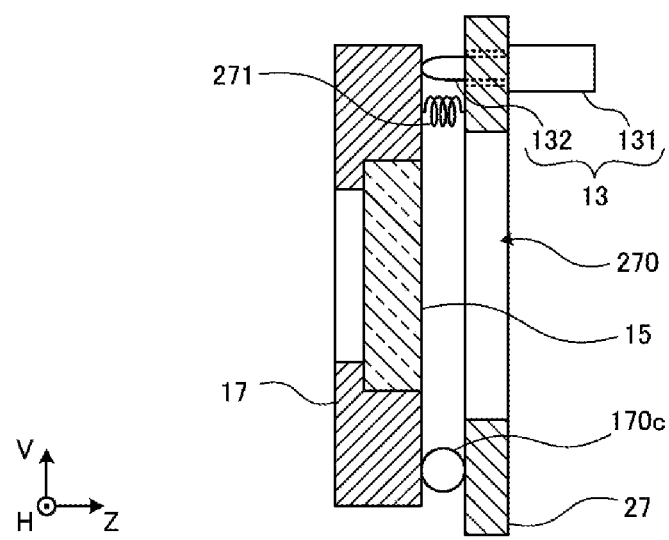
FIG. 17 is a sectional view taken along line XVII-XVII of FIG. 16.

FIG. 16 shows in detail the configuration of the adjustment device 13, the output coupling mirror 15, the first holder 17, and the second holder 27 in a third embodiment. FIG. 17 is a sectional view taken along line XVII-XVII of FIG. 16.

In the third embodiment, the first holder 17 may not include the taper portion 172, the protrusion portions 174, 176, and the like. The second holder 27 is arranged at a position on the +Z side with respect to the first holder 17 to face the first holder 17. The second holder 27 is arranged such that the output coupling mirror 15 and the through hole 270 of the second holder 27 overlap when viewed in the −Z direction. The second holder 27 supports the first holder 17 to be rotatable about the rotation axis 170 of the first holder 17. The rotation axis 170 is defined by point support portions 170c, 170d arranged between the first holder 17 and the second holder 27, and is substantially parallel to the H axis.

The drive unit 131 of the adjustment device 13 is fixed to the second holder 27. The expansion-contraction portion 132 penetrates the second holder 27, and the distal end of the expansion-contraction portion 132 is in contact with a surface of the first holder 17 on the +Z side. The expansion-contraction portion 132 is arranged at a position different from the position of the point support portion 170c in the +V direction. The expansion-contraction portion 132, the point support portion 170c, and the point support portion 170d are positioned so as to be three apexes of a substantially right triangle. The spring 271 is arranged in the vicinity of the expansion-contraction portion 132. One end of the spring 271 is fixed to the second holder 27, and the other end of the spring 271 is fixed to the first holder 17. The spring 271 is in tension.

4.2 Operation

When the drive unit 131 of the adjustment device 13 expands the expansion-contraction portion 132 in the −Z direction, the distal end of the expansion-contraction portion 132 presses the first holder 17 in the −Z direction. Then, the first holder 17 is rotated about the rotation axis 170 counterclockwise in FIG. 17 together with the output coupling mirror 15.

When the drive unit 131 of the adjustment device 13 contracts the expansion-contraction portion 132, the distal end of the expansion-contraction portion 132 moves in the +Z direction which is the direction away from the first holder 17. When the first holder 17 is pulled by the spring 271, the first holder 17 is rotated about the rotation axis 170 clockwise in FIG. 17 together with the output coupling mirror 15.

In the case in which the coefficient of thermal expansion of the second holder 27 is larger than that of the expansion-contraction portion 132, when the temperature of the expansion-contraction portion 132 and the second holder 27 rises, the position of the distal end of the expansion-contraction portion 132 in contact with the first holder 17 moves in the +Z direction. As a result, the first holder 17 is rotated clockwise in FIG. 17 together with the output coupling mirror 15 in the same manner as in the case in which the drive unit 131 contracts the expansion-contraction portion 132. That is, the first holder 17 is rotated so that a part of the first holder 17 above the rotation axis 170 is moved in the +Z direction.

Therefore, the laser light output from the output coupling mirror 15 is suppressed from being tilted downward with respect to the +Z direction. Thus, when the second holder 27 and the adjustment device 13 thermally expand due to temperature rise thereof, the first holder 17 is rotated in the direction to suppress downward change of the beam pointing of the laser light output from the output coupling mirror 15.

4.3 Other Configuration Example

In the third embodiment described with reference to FIGS. 16 and 17, description is provided on the case in which the output coupling mirror 15 rotates about the rotation axis 170 substantially parallel to the H axis, but the present disclosure is not limited thereto.

For example, an adjustment device (not shown) having a configuration similar to that of the adjustment device 13 may be arranged in place of the point support portion 170d at the same position as the point support portion 170d when viewed in the −Z direction. By expanding and contracting an expansion-contraction portion included in the adjustment device, the first holder 17 can be rotated about a rotation axis substantially parallel to the V axis defined by the point support portion 170c and the distal end of the expansion-contraction portion 132. That is, the first holder 17 can be rotated not only about the rotation axis 170 substantially parallel to the H axis but also about the rotation axis substantially parallel to the V axis.

In the third embodiment described with reference to FIGS. 16 and 17, the second holder 27 and the adjustment device 13 are located on the +Z side which is the output side of the laser light with respect to the first holder 17, but the present disclosure is not limited thereto.

Figure 18:
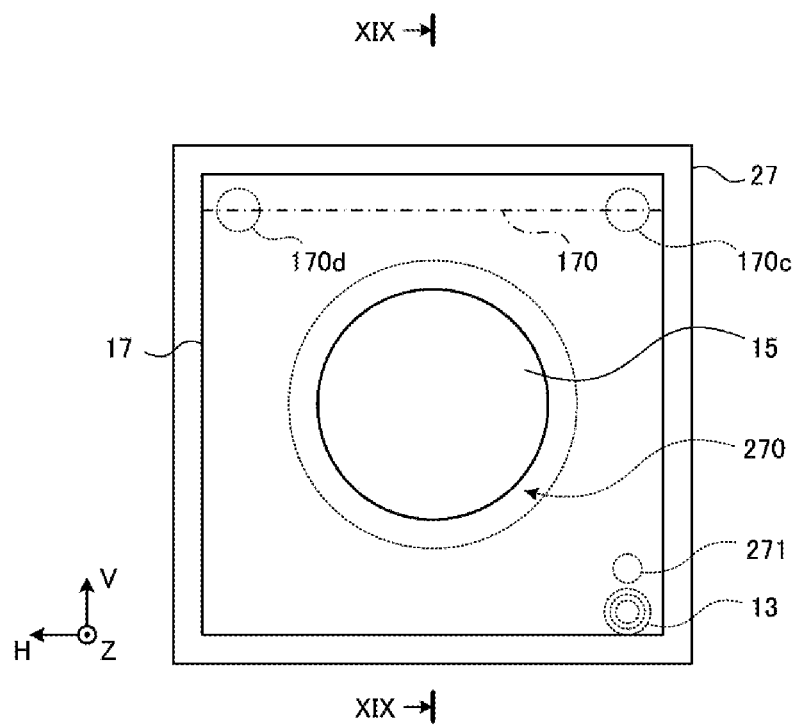
FIG. 18 shows in detail the configuration of the adjustment device, the output coupling mirror, the first holder, and the second holder in a modification of the third embodiment.
Figure 19:
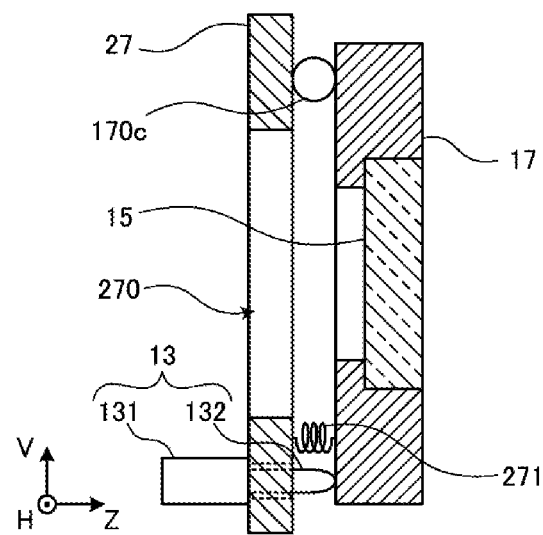
FIG. 19 is a sectional view taken along line XIX-XIX of FIG. 18.

FIG. 18 shows in detail the configuration of the adjustment device 13, the output coupling mirror 15, the first holder 17, and the second holder 27 in a modification of the third embodiment. FIG. 19 is a sectional view taken along line XIX-XIX of FIG. 18.

The second holder 27 may be located on the −Z side with respect to the first holder 17. The drive unit 131 of the adjustment device 13 may be fixed to the second holder 27, and the distal end of the expansion-contraction portion 132 may be in contact with the surface of the first holder 17 on the −Z side. In this case, the expansion-contraction portion 132 is arranged at a position different from the position of the point support portion 170c in the −V direction. Also in such a configuration, similarly to the third embodiment, the laser light output from the output coupling mirror 15 is suppressed from being tilted downward with respect to the +Z direction.

4.4 Effect

According to the third embodiment and the modification thereof, since the rotation axis 170 is shifted in the direction of the V axis from the center of the output coupling mirror 15, the degree of freedom of arrangement of the point support portion 170c and the point support portion 170d is high. Further, when the first holder 17 is rotated not only about the rotation axis 170 substantially parallel to the H axis but also about the rotation axis substantially parallel to the V axis, the third holder may not be provided. In other respects, the third embodiment and the modification thereof are similar to the second embodiment and the modification thereof.

5. COMBINATION OF MATERIALS OF SECOND HOLDER 27 AND EXPANSION-CONTRACTION PORTION 132

FIG. 20 shows examples of materials of the second holder 27 and the expansion-contraction portion 132. As the material of the second holder 27, any of aluminum, duralumin, ceramics, copper, and stainless steel (SUS) can be used. As the material of the expansion-contraction portion 132, either one of stainless steel and aluminum can be used. As a combination of materials of the second holder 27 and the expansion-contraction portion 132, a combination of materials each having different thermal expansion is selected so that the first holder 17 is rotated in a direction in which the downward change of the beam pointing of the laser light is suppressed by the thermal expansion when the temperature of the second holder 27 and the expansion and contraction portion 127 rises.

For example, No. 1 and No. 2 in FIG. 20 are combinations in which the coefficient of thermal expansion of the second holder 27 is larger than that of the expansion-contraction portion 132. In the first to third embodiments and the modifications thereof, the downward change in the beam pointing of the laser light is suppressed by selecting any one of the combinations.

For example, No. 3 to No. 7 in FIG. 20 are combinations in which the coefficient of thermal expansion of the second holder 27 is smaller than that of the expansion-contraction portion 132. When any of these combinations is employed, the rotation direction of the first holder 17 due to the thermal expansion of the second holder 27 and the adjustment device 13 is opposite to the rotation direction when either one of No. 1 and No. 2 is employed. For example, when arrangement such as the taper portion 179 of the comparative example described with reference to FIG. 2 is employed and any one of No. 3 to No. 7 in FIG. 20 is selected, the downward change in the beam pointing of the laser light is suppressed.

6. OTHERS

Figure 21:
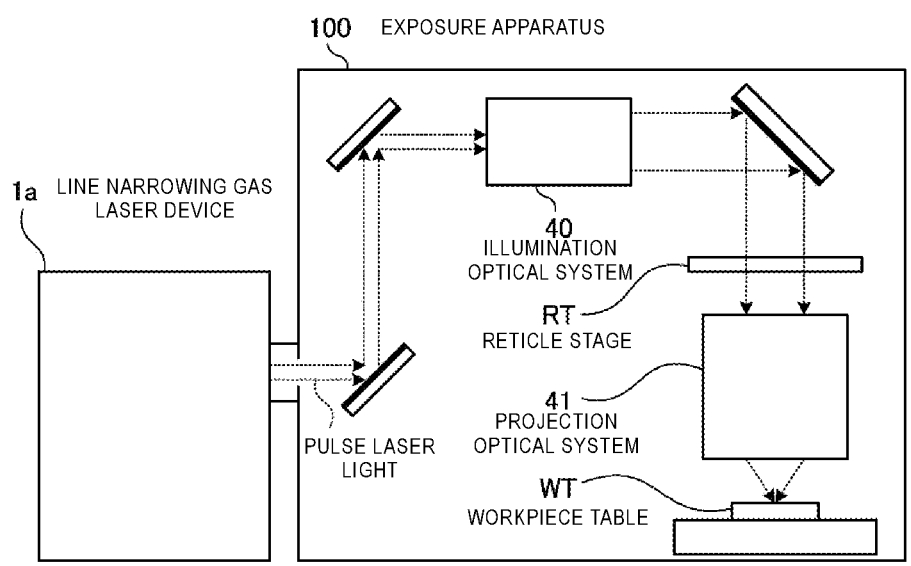
FIG. 21 schematically shows the configuration of an exposure apparatus connected to the laser device.

FIG. 21 schematically shows the configuration of an exposure apparatus 100 connected to the line narrowing gas laser device 1a. The line narrowing gas laser device 1a generates laser light and outputs the laser light to the exposure apparatus 100. In FIG. 21, the exposure apparatus 100 includes an illumination optical system 40 and a projection optical system 41. The illumination optical system 40 illuminates a reticle pattern of a reticle (not shown) arranged on a reticle stage RT with the laser light having entered from the line narrowing gas laser device 1a. The projection optical system 41 causes the laser light transmitted through the reticle to be imaged as being reduced and projected on a workpiece (not shown) arranged on a workpiece table WT. The workpiece is a photosensitive substrate such as a semiconductor wafer on which photoresist is applied. The exposure apparatus 100 synchronously translates the reticle stage RT and the workpiece table WT to expose the workpiece to the laser light reflecting the reticle pattern. After the reticle pattern is transferred onto the semiconductor wafer by the exposure process described above, an electronic device can be manufactured through a plurality of processes.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A line narrowing gas laser device, comprising:
   a line narrowing device including a wavelength dispersion element;
   an output coupling mirror;
   a laser chamber arranged on an optical path of an optical resonator configured by the line narrowing device and the output coupling mirror;
   a first holder which supports the output coupling mirror;
   a second holder which supports the first holder to be rotatable about a rotation axis of the first holder; and
   an adjustment device supported by the second holder and being in contact with the first holder to rotate the first holder about the rotation axis,
   the line narrowing device being configured to have a characteristic of changing, into a first direction, beam pointing of laser light output toward the output coupling mirror when temperature inside the line narrowing device rises, and
   the second holder and the adjustment device being configured to rotate the first holder in a direction in which a change in the first direction in the beam pointing of the laser light output from the output coupling mirror is suppressed by thermal expansion when temperature of the second holder and the adjustment device rises.

2. The line narrowing gas laser device according to claim 1,
   wherein the adjustment device includes a drive unit supported by the second holder, and an expansion-contraction portion configured to expand and contract with respect to the drive unit and be in contact with the first holder.

3. The line narrowing gas laser device according to claim 2, wherein the first holder includes a tilt surface, and the expansion-contraction portion is in contact with the tilt surface and expands and contracts in a direction intersecting the tilt surface.

4. The line narrowing gas laser device according to claim 2, wherein the first holder includes a taper portion having a tilt surface at a position above the output coupling mirror, a normal line of the tilt surface in a direction away from the taper portion has a direction component in an output direction of the laser light and a direction component opposite to the gravity direction, and the expansion-contraction portion is in contact with the tilt surface and expands and contracts in a direction intersecting the tilt surface.

5. The line narrowing gas laser device according to claim 2, wherein the first holder includes a taper portion having a tilt surface at a position below the output coupling mirror, a normal line of the tilt surface in a direction away from the taper portion has a direction component in a direction opposite to an output direction of the laser light and a direction component in the gravity direction, and the expansion-contraction portion is in contact with the tilt surface and expands and contracts in a direction intersecting the tilt surface.

6. The line narrowing gas laser device according to claim 2, wherein an expansion-contraction direction of the expansion-contraction portion has a direction component parallel to an output direction of the laser light.

7. The line narrowing gas laser device according to claim 2, wherein the adjustment device is located on an output side of the laser light with respect to the first holder, and the expansion-contraction portion is in contact with a surface of a part of the first holder above the rotation axis.

8. The line narrowing gas laser device according to claim 2, wherein the adjustment device is located on a side opposite to an output side of the laser light with respect to the first holder, and the expansion-contraction portion is in contact with a surface of a part of the first holder below the rotation axis.

9. The line narrowing gas laser device according to claim 2, wherein a coefficient of thermal expansion of the second holder is larger than that of the expansion-contraction portion.

10. The line narrowing gas laser device according to claim 1, wherein the second holder and the adjustment device rotate the first holder so that a part of the first holder above the rotation axis moves in an output direction of the laser light by thermal expansion when the temperature of the second holder and the adjustment device rises, thereby suppressing a change in the first direction in the beam pointing of the laser light output from the output coupling mirror.

11. A line narrowing gas laser device, comprising:
a line narrowing device including a wavelength dispersion element;
an output coupling mirror;
a laser chamber arranged on an optical path of an optical resonator configured by the line narrowing device and the output coupling mirror;
a first holder which supports the output coupling mirror;
a second holder which supports the first holder to be rotatable about a rotation axis of the first holder; and
an adjustment device supported by the second holder and being in contact with the first holder to rotate the first holder about the rotation axis,
the second holder and the adjustment device being configured to rotate the first holder so that a part above the rotation axis of the first holder moves in an output direction of laser light output from the output coupling mirror by thermal expansion when temperature of the second holder and the adjustment device rises.

12. The line narrowing gas laser device according to claim 11, wherein the adjustment device includes a drive unit supported by the second holder, and an expansion-contraction portion configured to expand and contract with respect to the drive unit and be in contact with the first holder.

13. The line narrowing gas laser device according to claim 12, wherein the first holder includes a tilt surface, and the expansion-contraction portion is in contact with the tilt surface and expands and contracts in a direction intersecting the tilt surface.

14. The line narrowing gas laser device according to claim 12, wherein the first holder includes a taper portion having a tilt surface at a position above the output coupling mirror, a normal line of the tilt surface in a direction away from the taper portion has a direction component in an output direction of the laser light and a direction component opposite to the gravity direction, and the expansion-contraction portion is in contact with the tilt surface and expands and contracts in a direction intersecting the tilt surface.

15. The line narrowing gas laser device according to claim 12, wherein the first holder includes a taper portion having a tilt surface at a position below the output coupling mirror, a normal line of the tilt surface in a direction away from the taper portion has a direction component in a direction opposite to an output direction of the laser light and a direction component in the gravity direction, and the expansion-contraction portion is in contact with the tilt surface and expands and contracts in a direction intersecting the tilt surface.

16. The line narrowing gas laser device according to claim 12, wherein an expansion-contraction direction of the expansion-contraction portion has a direction component parallel to an output direction of the laser light.

17. The line narrowing gas laser device according to claim 12, wherein the adjustment device is located on an output side of the laser light with respect to the first holder, and the expansion-contraction portion is in contact with a surface of a part of the first holder above the rotation axis.

18. The line narrowing gas laser device according to claim 12, wherein the adjustment device is located on a side opposite to an output side of the laser light with respect to the first holder, and the expansion-contraction portion is in contact with a surface of a part of the first holder below the rotation axis.

19. The line narrowing gas laser device according to claim 12, wherein a coefficient of thermal expansion of the second holder is larger than that of the expansion-contraction portion.

20. An electronic device manufacturing method, comprising:

generating laser light using a line narrowing gas laser device;

outputting the laser light to an exposure apparatus; and exposing a photosensitive substrate to the laser light in the exposure apparatus to manufacture an electronic device, the line narrowing gas laser device including:

a line narrowing device including a wavelength dispersion element;

an output coupling mirror;

a laser chamber arranged on an optical path of an optical resonator configured by the line narrowing device and the output coupling mirror;

a first holder which supports the output coupling mirror;

a second holder which supports the first holder to be rotatable about a rotation axis of the first holder; and an adjustment device supported by the second holder and being in contact with the first holder to rotate the first holder about the rotation axis, the line narrowing device being configured to have a characteristic of changing, into a first direction, beam pointing of the laser light output toward the output coupling mirror when temperature inside the line narrowing device rises, and the second holder and the adjustment device being configured to rotate the first holder in a direction in which a change in the first direction in the beam pointing of the laser light output from the output coupling mirror is suppressed by thermal expansion when temperature of the second holder and the adjustment device rises.

* * * * *